US008117489B2

(12) United States Patent
Hiratsuka et al.

(10) Patent No.: US 8,117,489 B2
(45) Date of Patent: Feb. 14, 2012

(54) DISK DRIVE AND METHOD FOR CONTROLLING THE DISK DRIVE

(75) Inventors: Yukie Hiratsuka, Tokyo (JP); Hideki Saga, Tokyo (JP)

(73) Assignee: Hitachi Global Storage Technologies, Netherlands B.V., Amsterdam (NL)

(*) Notice: Subject to any disclaimer, the term of this patent is extended or adjusted under 35 U.S.C. 154(b) by 239 days.

(21) Appl. No.: 12/479,460

(22) Filed: Jun. 5, 2009

(65) Prior Publication Data

US 2009/0307525 A1    Dec. 10, 2009

(30) Foreign Application Priority Data

Jun. 6, 2008    (JP) ................................ 2008-149037

(51) Int. Cl.
*G06F 11/00*    (2006.01)

(52) U.S. Cl. ........................................ 714/6.1; 714/6.11

(58) Field of Classification Search ............... 714/8, 6.1, 714/6.11
See application file for complete search history.

(56) References Cited

U.S. PATENT DOCUMENTS

| 5,644,539 | A | 7/1997 | Yamagami et al. | |
|---|---|---|---|---|
| 2007/0079065 | A1* | 4/2007 | Bonella et al. | 711/113 |
| 2007/0162693 | A1 | 7/2007 | Nam | |
| 2007/0300101 | A1* | 12/2007 | Stewart | 714/8 |
| 2008/0077729 | A1* | 3/2008 | Kim et al. | 711/103 |
| 2009/0157940 | A1* | 6/2009 | Sanvido | 711/5 |

FOREIGN PATENT DOCUMENTS

| JP | 2005122529 | 5/2005 |
|---|---|---|
| JP | 2006018893 | 1/2006 |

* cited by examiner

*Primary Examiner* — Scott Baderman
*Assistant Examiner* — Jigar Patel

(57) ABSTRACT

A disk drive. The disk drive includes a non-volatile memory that is incapable of being overwritten more than a limited number of times, a disk and a controller. The controller includes a memory management table used to manage a correlation between a logical block address (LBA) and a physical address of the non-volatile memory. In the absence of a replaceable region in the non-volatile memory and in response to an occurrence of a failure to write data in a region, defined as a failure region, in the non-volatile memory at a first physical address correlated with a first LBA, the controller is configured to write the data at a second physical address correlated with a second LBA of the non-volatile memory different from the first LBA, and is configured to correlate in the memory management table the first LBA with the second physical address.

16 Claims, 16 Drawing Sheets

| LBA | PHYSICAL ADDRESS | REPLACEMENT BIT |
|---|---|---|
| N-1 | 0x001ff | 0 |
| N-2 | 0x000aa | 0 |
| ⋮ | ⋮ | ⋮ |
| 0 | 0x11101 | 0 |

FIG. 5

| 704 | 805 PHYSICAL ADDRESS OF MEMORY | 810 SIZE SECTORS | 815 ACCESS ORDER AT START-UP | 820 INVALID FLAG |
|---|---|---|---|---|
| LBA | | | | |
| 0x10000001 | 0x01ff | 128 | 1 | 0 |
| 0x40500002 | 0x02aa | 64 | 2 | 0 |
| ⋮ | ⋮ | ⋮ | ⋮ | ⋮ |
| 0x34400224 | 0x55aa | 256 | 162 | 1 |

FIG. 8

| 1004 | 1110 | 1115 | | 1120 |
|---|---|---|---|---|
| TYPE OF REGION | RANGE OF REGION (LBA ON MEMORY) | | | SIZE (KB) |
| BUFFER REGION | START ADDRESS | 0 | | 128000 |
| | FINAL ADDRESS | 0x3d090 | | |
| CACHE REGION | START ADDRESS | 0x3d091 | | 128000 |
| | FINAL ADDRESS | Max | | |

FIG. 11

| TYPE OF REGION | PRIORITY |
|---|---|
| BUFFER REGION | 2 |
| CACHE REGION | 1 |

| 1604 | 1810 | 1815 | 1820 | 1825 | 1830 |
|---|---|---|---|---|---|
| LBA | PHYSICAL ADDRESS OF MEMORY | SIZE SECTORS | REMOVAL BY MEMBER OTHER THAN HOST IS ALLOWED OR INHIBITED | INVALID FLAG |
| 0x10000001 | 0x01ff | 128 | 0 | 0 |
| 0x40500002 | 0x02aa | 64 | 0 | 0 |
| : | : | : | : | : |
| 0x34400224 | 0x55aa | 256 | 0 | 1 |

| | | |
|---|---|---|
| 1925 | Feature | 0010h |
| 1920 | Count | Number of 512-byte data blocks |
| 1915 | LBA | 47:1 Reserved<br>0 Populate Immediately |
| 1910 | Device | 15:13 N/A<br>12 Transport Dependent<br>11:8 Reserved |
| 1905 | Command | 7:0 B6h |

FIG. 19

DISK DRIVE AND METHOD FOR CONTROLLING THE DISK DRIVE

CROSS-REFERENCE TO RELATED APPLICATION

This application claims priority from the Japanese Patent Application No. 2008-149037, filed Jun. 6, 2008, the disclosure of which is incorporated herein in its entirety by reference.

TECHNICAL FIELD

Embodiments of the present invention relate to disk drives and methods for controlling a disk drive.

BACKGROUND

Technological development is under way for a disk drive capable of achieving improvements in a data transfer rate and a power-savings by incorporating a semiconductor non-volatile memory (hereinafter, referred to as the non-volatile memory). The non-volatile memory has a high data transfer rate to the disk drive and consumes less power. These developments provide data processing by exploiting the respective characteristics of the disk drive and the non-volatile memory.

A boot program of a computer, such as an operating system, or a frequently used application program may be pre-stored in non-volatile memory, so that start-up time is shortened by increasing the data transfer rate to the host computer. Also, power may be saved by spinning down the disk so that write data is buffered in non-volatile memory or read data is transferred from non-volatile memory during the spin down. The disk drive as described above chiefly uses a flash memory having a low cost per bit, as non-volatile memory. The flash memory has random access capability and consumes little power. However, because the number of overwrites to the flash memory is limited, when flash memory is used by an application in which data is overwritten frequently, flash memory may fail to endure extended use over a long period of time.

SUMMARY

Embodiments of the present invention include a disk drive. The disk drive includes a non-volatile memory that is incapable of being overwritten more than a limited number of times, a disk and a controller. The controller includes a memory management table used to manage a correlation between a logical block address (LBA) and a physical address of the non-volatile memory. In the absence of a replaceable region in the non-volatile memory and in response to an occurrence of a failure to write data in a region, defined as a failure region, in the non-volatile memory at a first physical address correlated with a first LBA, the controller is configured to write the data at a second physical address correlated with a second LBA of the non-volatile memory different from the first LBA, and is configured to correlate in the memory management table the first LBA with the second physical address.

DESCRIPTION OF THE DRAWINGS

The accompanying drawings, which are incorporated in and form a part of this specification, illustrate embodiments of the invention and, together with the description, serve to explain the embodiments of the present invention:

FIG. 5 is a diagram illustrating an example configuration of a memory address management table, in accordance with the first embodiment of the present invention.

FIG. 8 is a diagram illustrating an example configuration of an access order management table, in accordance with the second embodiment of the present invention.

FIG. 11 is a diagram illustrating an example configuration of a memory region management table, in accordance with the third embodiment of the present invention.

FIG. 18 is a diagram illustrating an example configuration of a memory data management table, in accordance with the fourth embodiment of the present invention.

FIG. 19 is a diagram illustrating the configuration of a command, in accordance with the fourth embodiment of the present invention.

Figure 1:
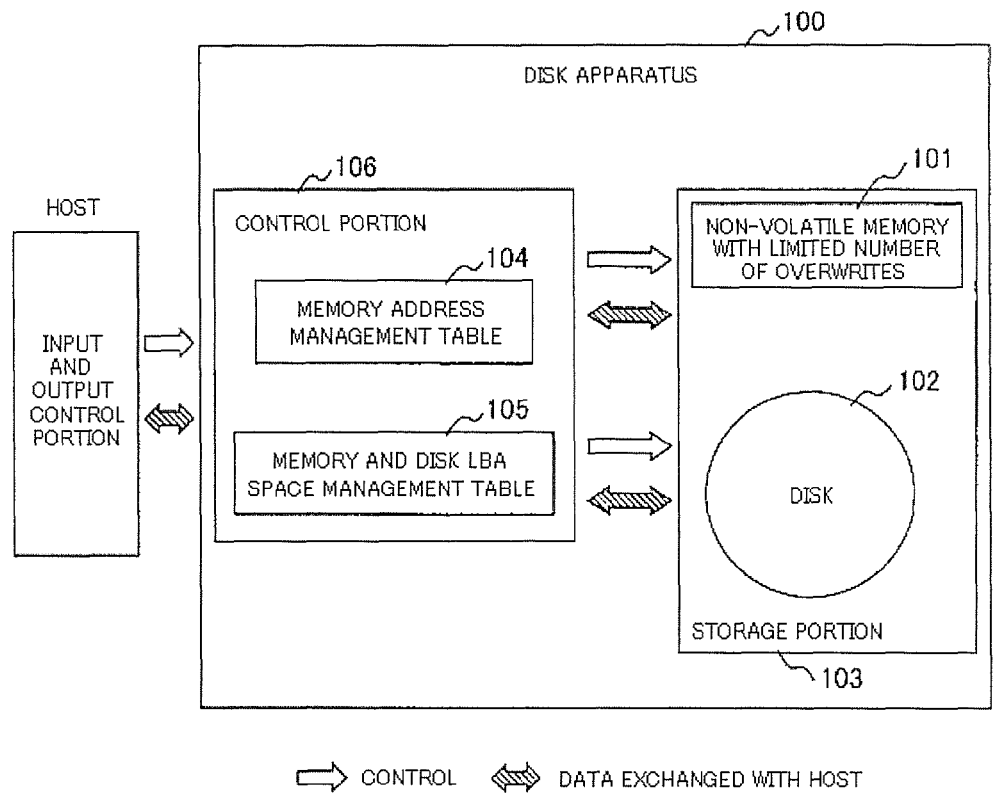
FIG. 1 is a block diagram illustrating an example configuration of a disk drive, in accordance with a first embodiment of the present invention.

The drawings referred to in this description should not be understood as being drawn to scale except if specifically noted.

DESCRIPTION OF EMBODIMENTS

Reference will now be made in detail to the alternative embodiments of the present invention. While the invention will be described in conjunction with the alternative embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following description of embodiments of the present invention, numerous specific details are set forth in order to provide a thorough understanding of the present invention. However, it should be noted that embodiments of the present invention may be practiced without these specific details. In other instances, well known methods, procedures, and components have not been described in detail as not to unnecessarily obscure embodiments of the present invention.

Description of Embodiments of the Present Invention for a Disk Drive and Method for Controlling the Disk Drive In accordance with embodiments of the present invention, durability of a flash memory is enhanced by controlling operations in such a manner that overwriting will not take place intensively in a particular physical block or by replacing a block having a failure with a spare block. In the flash memory, processing is performed to make the number of overwrites equal or to replace a block having reached the pre-set number of overwrites with a spare block. However, when a predetermined capacity becomes unavailable because all the spare blocks are used, the memory as a whole becomes unavailable. Accordingly, the data transfer rate and the power-saving effect deteriorate abruptly in a disk drive incorporating the flash memory when the flash memory becomes unavailable. In accordance with embodiments of the present invention, a disk drive incorporating a non-volatile memory with a limited number of overwrites continues to use the non-volatile memory efficiently even when a replaceable region in the non-volatile memory has been exhausted. As used herein, a non-volatile memory with a limited number of overwrites may be a non-volatile memory that is incapable of being overwritten more than a limited number of times.

In accordance with embodiments of the present invention, for a state in which there is no replaceable region in the non-volatile memory, which is a state in which the replaceable region has been exhausted, the disk drive and the control method of the disk drive are configured as follows. In one embodiment of the present invention, the disk drive includes a non-volatile memory with a limited number of overwrites, a disk, and a controller that includes a memory management table used to manage a correlation between a logical block address (LBA) and a physical address of the non-volatile memory. In response to an occurrence of a failure in a region at a physical address correlated with an LBA at which data was supposed to be written on the non-volatile memory, the controller writes the data at a physical address correlated with an LBA of the non-volatile memory different from the LBA at which the data was supposed to be written, and correlates the LBA at which the data was supposed to be written with the physical address at which the data has been written in the memory management table. As described herein, a controller may be the control portion of the disk drive.

In accordance with another embodiment of the present invention, the disk has a replaceable region in the non-volatile memory and a storage region of an LBA continuing to an LBA allocated to the non-volatile memory. The controller selects an LBA of the non-volatile memory different from an LBA at which data was supposed to be written as an LBA continuing to the storage portion of the disk, and in response to an occurrence of a failure in a region at a physical address correlated with the LBA at which the data was supposed to be written in the non-volatile memory, writes data stored at the physical address on the non-volatile memory correlated with the selected LBA continuing to the LBA of the storage region in the disk at a physical address, which is a replaceable region, of the disk correlated with the selected LBA. In accordance with one embodiment of the present invention, the controller switches an access to the LBA continuing to the LBA of the storage portion in the disk to an access to the LBA of the replaceable region, writes the data that was supposed to be written into the failure region at the physical address on the non-volatile memory correlated with the LBA continuing to the LBA of the storage portion in the disk, and correlates the LBA at which the data was supposed to be written with the physical address at which the data has been written in the memory management table.

In accordance with another embodiment of the present invention, the disk stores a boot program of a host system connected to the disk and the non-volatile memory pre-stores a copy of the boot program. An access order from the host system to the boot program stored in the non-volatile memory is preliminarily set. The controller selects, as an LBA of the non-volatile memory different form an LBA at which the data was supposed to be written, an LBA placed last in the access order in the boot program stored in the non-volatile memory with reference to the access order.

In accordance with another embodiment of the present invention, the controller selects, as an LBA of the non-volatile memory different from an LBA at which the data was supposed to be written, an LBA corresponding to a region included in a region assigned with a lower priority with reference to priorities preliminarily assigned to regions in the non-volatile memory.

In accordance with another embodiment of the present invention, a region in which to store data that cannot be invalidated without an instruction from the host system and another region in which to store data that may be invalidated without an instruction from the host system are provided in the non-volatile memory. The controller selects, as an LBA of the non-volatile memory different from an LBA at which the data was supposed to be written, an LBA corresponding to a region included in the region in which to store the data that may be invalidated without an instruction from the host system.

In accordance with another embodiment of the present invention, the disk drive has a memory management table used to manage a correlation between an LBA and a physical address of the non-volatile memory. In a case in which a failure region occurs at a physical address correlated with an LBA at which the data was supposed to be written in a state where there is no replaceable region in the non-volatile memory, which is a state where the replaceable region has been exhausted, the disk drive operates as follows. The disk drive writes the data at a physical address correlated with an LBA of the non-volatile memory that is different from the LBA at which the data was supposed to be written. When configured in this manner, a region that is invalidated due to the occurrence of the failure region becomes controllable. Consequently, the disk drive becomes able to use the non-volatile memory efficiently.

Descriptions of embodiments of the present invention will be given for the case in which the disk and the non-volatile memory together form a single continuous logical location and provide a replaceable region in the non-volatile memory on the disk according to: a first embodiment of the present invention in which a region in the non-volatile memory is replaced with the replaceable region on the disk successively from LBA's continuing to the logical location on the disk; a second embodiment of the present invention in which a part of a region in the disk is copied and stored into the non-volatile memory and for a case in which the stored data has the access order, such that accesses to the data are switched to accesses to the disk sequentially in ascending access order; a third embodiment of the present invention for a case in which priorities are preliminarily assigned to regions in the non-volatile memory, such that regions assigned with lower priorities are invalidated; and a fourth embodiment of the present invention for a case in which a region from which data cannot be removed without an instruction from the host and a region from which data may be removed without an instruction are provided in the non-volatile memory, such that the region from which data may be removed without an instruction from the host is invalidated.

First Embodiment of the Present Invention

With reference now to FIG. 1, in accordance with a first embodiment of the present invention, a block diagram is shown; the block diagram shows an example configuration of a disk drive. The disk drive (100) has a storage portion (103) including a non-volatile memory (101) with a limited number of overwrites and a disk (102) having a replaceable region in the non-volatile memory inside, and a controller, which is identified with a control portion (106) of the disk drive as shown in FIG. 1, which includes memory address management table (104) used to manage data in the non-volatile memory (101) and a memory and disk LBA location management table (105) used to manage an LBA location of the non-volatile memory (101) and the disk (102).

Figure 2:
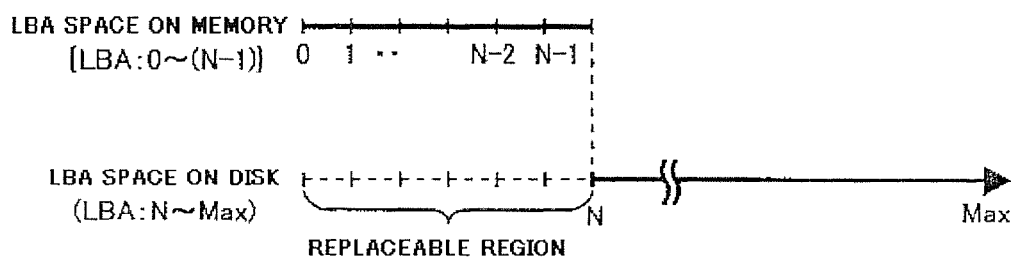
FIG. 2 is a diagram illustrating an example logical block address (LBA) location formed in the disk drive, in accordance with the first embodiment of the present invention

With reference now to FIG. 2, in accordance with the first embodiment of the present invention, a diagram is shown that illustrates an example of the LBA location formed in the disk drive (100). Referring to FIG. 2, 0 to an LBA (N-1) are allocated to the non-volatile memory (101) and an LBA N to a maximum address, which is a maximum address determined by a disk capacity, are allocated to the disk (102).

Figure 3:
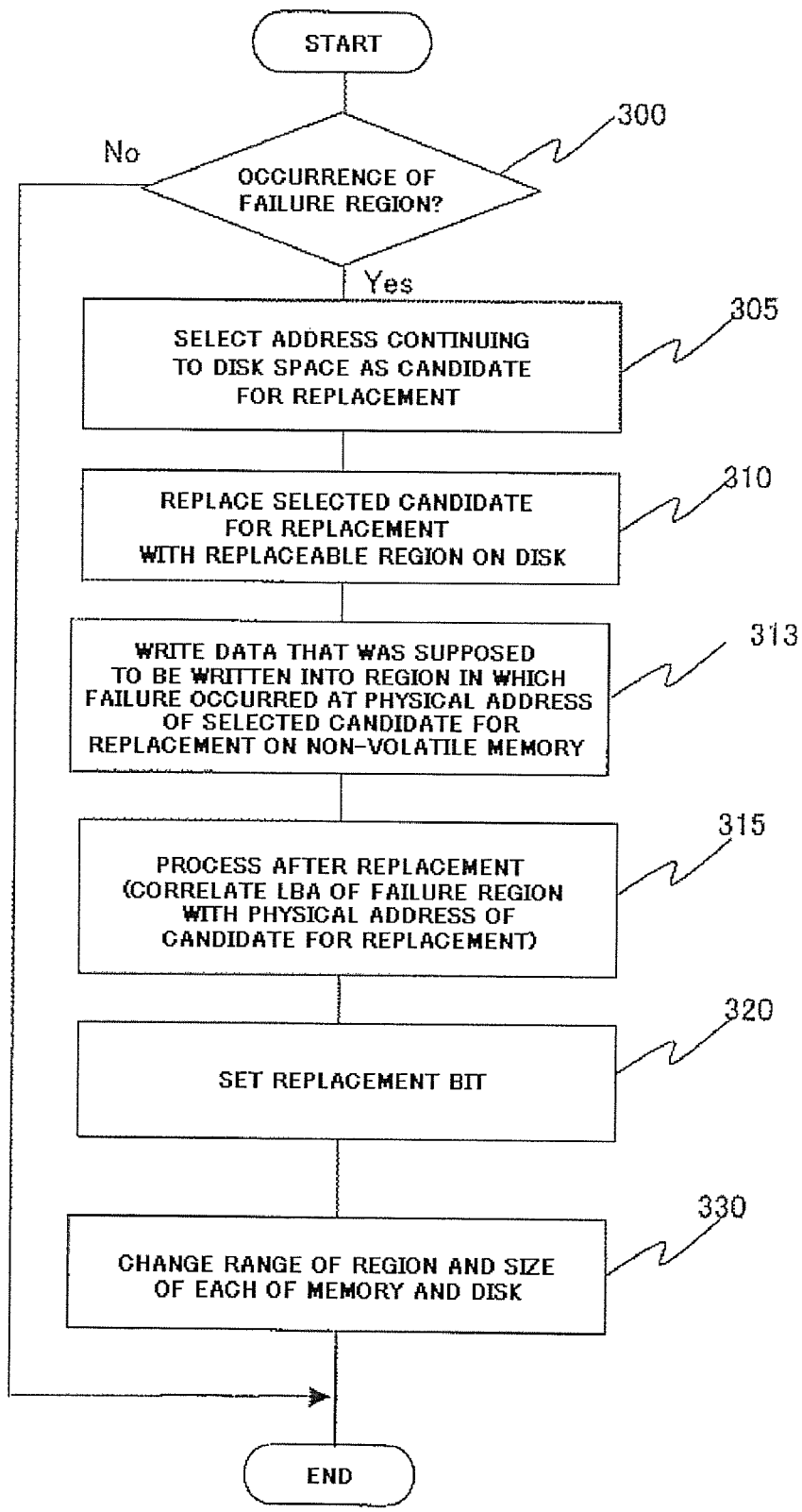
FIG. 3 is a flow chart illustrating an example replacement process in the disk drive, in accordance with the first embodiment of the present invention.
Figure 4:
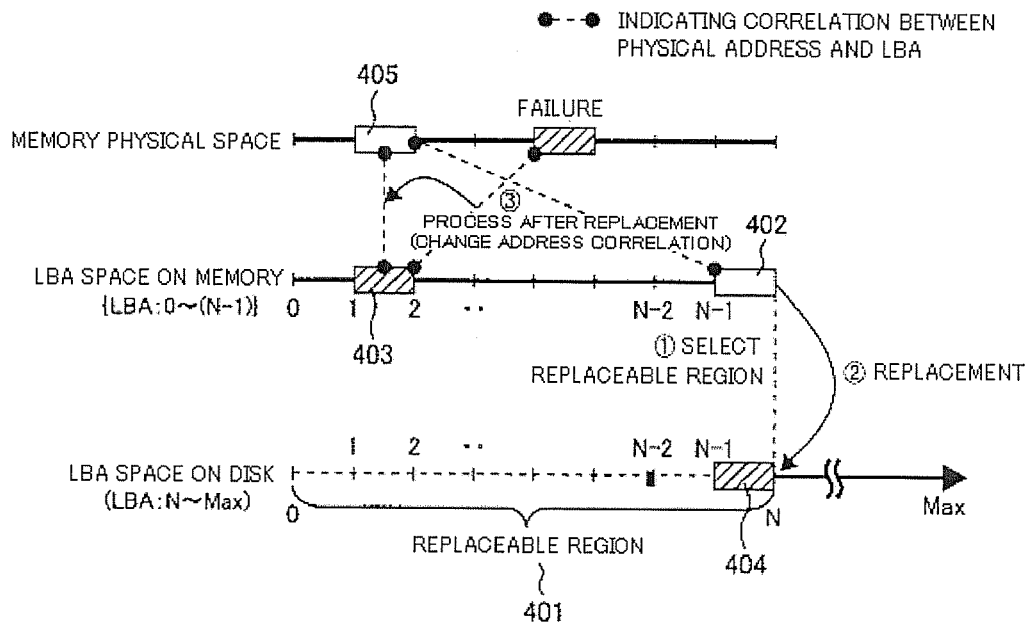
FIG. 4 is a diagram illustrating example operations during the replacement process, in accordance with the first embodiment of the present invention.

With reference now to FIG. 3, in accordance with the first embodiment of the present invention, a flow chart is shown. The flow chart shows an example replacement process performed by the controller, identified with the control portion (106), in the disk drive (100). The flow chart of FIG. 3 details the replacement process in a case in which a failure region occurs after a replaceable region pre-set in the non-volatile memory (101) has been exhausted. At 300, occurrence of a failure region in the non-volatile memory (101) is tested for; upon occurrence of the failure region, the controller, identified with control portion (106), at 305, selects an LBA on the non-volatile memory continuing to the LBA location on the disk (102) as a candidate for replacement With reference now to FIG. 4, in accordance with the first embodiment of the present invention, a diagram is shown that illustrates example operations during the replacement process. Referring to FIG. 4, LBA's 0 to (N-1) are allocated as an address location on the non-volatile memory (101) and an LBA N to the maximum address are allocated as a logical location on the disk (102). In the example of FIG. 4, a location from the LBA's 0 to N on the disk (102) is secured as a replaceable region (401) in the non-volatile memory (101). LBA's and physical addresses are correlated with each other region by region in the non-volatile memory (101). According to the replacement process illustrated in FIG. 4, upon occurrence of a failure region on the non-volatile memory (101), the controller, identified with control portion (106), selects an LBA (N-1) (402) of the non-volatile memory (101) continuing to the LBA location (from N and so on) on the disk (102) as a candidate for replacement.

With reference once again to FIG. 3, in accordance with the first embodiment of the present invention, at 310, the controller, identified with control portion (106), replaces the selected candidate for replacement (402) with the replaceable region on the disk (102). Subsequently, at 313, the controller, identified with control portion (106), writes the data that was supposed to be written into the region in which a failure occurred at a physical address of the selected candidate for replacement on the non-volatile memory. Finally, at 315, as a process after the replacement, the controller, identified with control portion (106), correlates the LBA of the failure region with the physical address of the replaced region With further reference to FIG. 4, in accordance with the first embodiment of the present invention, the region in which the failure occurred is the LBA 1 (403). Accordingly, the controller, identified with control portion (106), selects (N-1) (402), which is an address on the memory continuing to the logical location on the disk, as a candidate for the replaceable region, and replaces this LBA (N-1) (402) with (N-1) (404) in the region for replacement continuing to an address N on the disk (102). In short, data at the physical address correlated with the LBA N-1 on the non-volatile memory is moved to the physical address correlated with the LBA N-1 on the disk. Subsequently, the controller, identified with control portion (106), writes the data that was supposed to be written into the region in which the failure occurred at the physical address on the non-volatile memory that is correlated with the LBA N-1 selected as the replaceable region. Finally, the controller, identified with control portion (106), correlates the physical address (405) on the non-volatile memory correlated with the LBA (N-1) (402) selected as the replaceable region with the LBA 1 (403), which is the region in which the failure occurred. Consequently, the data in the region in which the failure occurred is left continuously in the non-volatile memory and the data in the region continuing to the logical location on the disk is replaced with the replaceable region on the disk.

With reference once again to FIG. 3, in accordance with the first embodiment of the present invention, at 320, the controller, identified with control portion (106), sets a replacement bit of the replaced address to 1 in the memory address management table (104). FIG. 5 shows an example of the configuration of the memory address management table (104). The memory address management table (104) is formed of LBA's (500) and physical addresses (505) of data stored in the non-volatile memory and replacement bits (510) indicating whether a replacement process has occurred with the data. At 330, the controller, identified with control portion (106), changes the ranges of the regions and the sizes of the regions in the non-volatile memory (101) and the disk (102).

Figure 6:
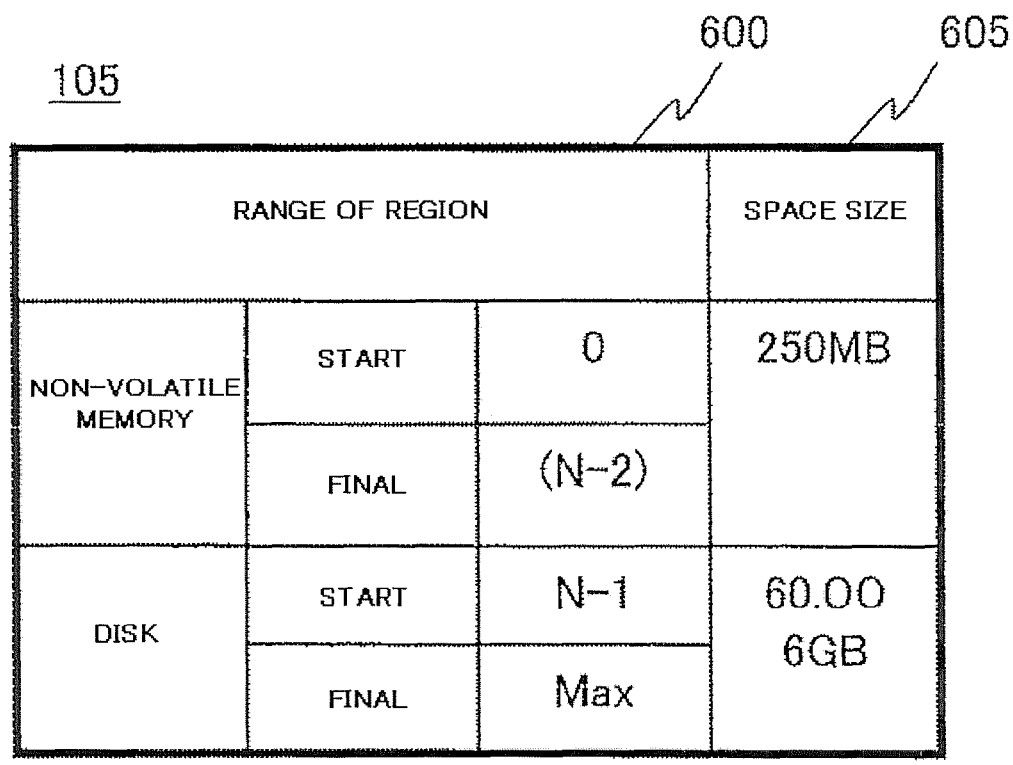
FIG. 6 is a diagram illustrating an example configuration of a memory and disk LBA location management table, in accordance with the first embodiment of the present invention.

With reference now to FIG. 6, in accordance with the first embodiment of the present invention, a diagram is shown; the diagram shows an example of the configuration of a memory and disk LBA location management table (105) used to manage an LBA location of the non-volatile memory (101) and the disk (102). The memory and disk LBA location management table (105) is formed of ranges of regions (600) in which to store a start address and a last address of a region in each of the non-volatile memory (101) and the disk (102), and location sizes (605) in which to store the size of a logical location on each medium. The disk drive (100) corrects the ranges of regions, which are given by a start address and a last address of the respective regions, and the size of the region in each of the non-volatile memory (101) and the disk (102) when a sequence of the replacement process detailed in FIG. 3 ends.

Second Embodiment of the Present Invention

In accordance with a second embodiment of the present invention, on a disk drive provided with a non-volatile memory with a limited number of overwrites, an access to the internal non-volatile memory is allowed as soon as the power is supplied to the disk drive. On the other hand, because it takes time for the disk to spin up, an access to the disk is not allowed for a while, which may be about several seconds. Also, the non-volatile memory is characterized by its high random reading rate. A random access occurs at a relatively high frequency with the boot program. In accordance with the second embodiment of the present invention, in order to start up the host in a short time, a method is provided to use the non-volatile memory for storing the boot program in the non-volatile memory. A region in the non-volatile memory other than the region in which the boot program has been stored is used as a region for data to which read accesses are frequently made by the host. The boot program may not be limited to just the operating system (OS) in the host; and boot program may include an application program set to start running as soon as the OS starts.

Figure 7:
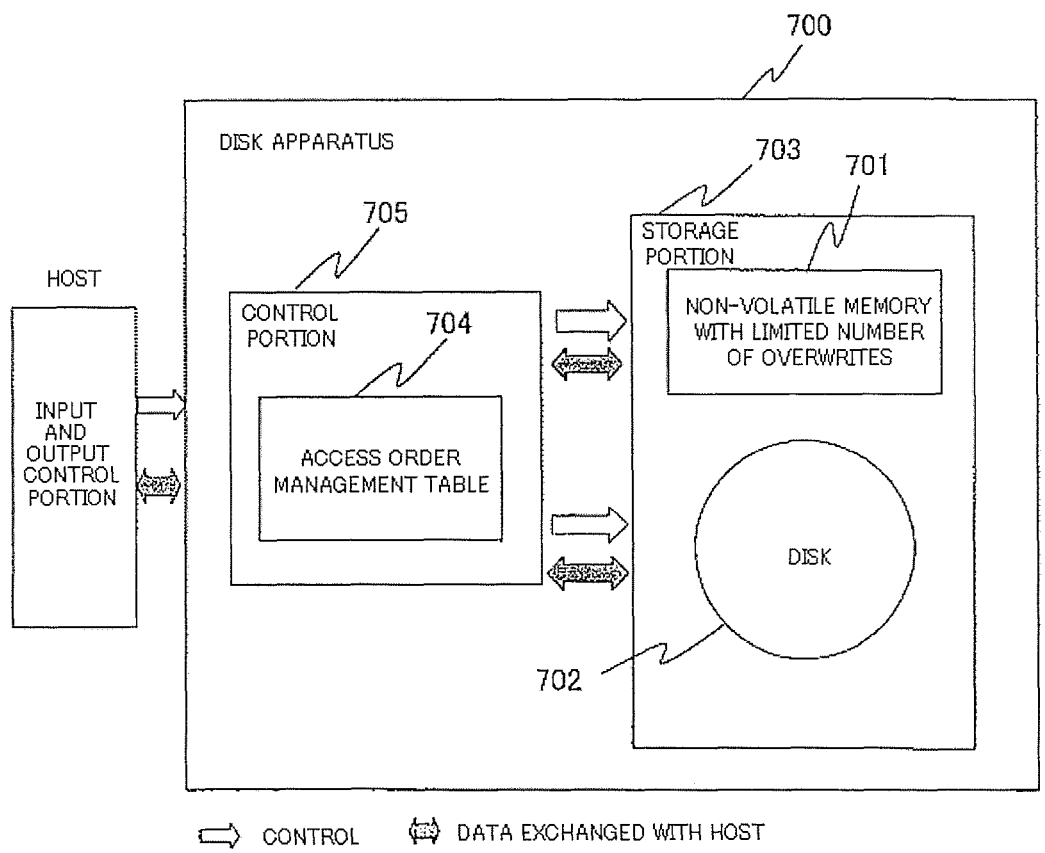
FIG. 7 is a block diagram illustrating an example configuration of a disk drive, in accordance with a second embodiment of the present invention.

With reference now to FIG. 7, in accordance with the second embodiment of the present invention, a block diagram is shown; the block diagram shows another example configuration of a disk drive (700). The disk drive (700) has a storage portion (703) including a non-volatile memory (701) with a limited number of overwrites and a disk (702) and a controller, which is identified with control portion (705) of the disk drive (705) as shown in FIG. 7, provided with an access order management table (704) used to manage the access order of the data on the non-volatile memory (701). In the disk drive (700), the boot program of the system, which is the host, pre-stored on the disk (702) is copied and preliminarily stored in the non-volatile memory (701). Accordingly, data on the non-volatile memory (701) is the boot program and the access order is the order in which the host loads the boot program.

With reference now to FIG. 8, in accordance with the second embodiment of the present invention, a diagram is shown; the diagram shows an example of the access order management table (704) stored on the non-volatile memory (701), in which the access order of the boot program of the system is stored. The access order management table (704) has items under the title of physical address of non-volatile memory (810), size of region (815), access order at start-up (820), and invalid flag (825) indicating that a region is invalid, all of which are correlated with an LBA (805). For example, the first entry of the access order management table (704) indicates that the top address of the LBA is 0x10000001 and a region of 128 sectors at the physical address, 0x01ff, is accessed first at the start-up. According to the access order management table (704) shown in FIG. 8, a region at the LBA in the last entry starting from 0x34400224 is the region accessed last (162'nd access) at the start-up. Accordingly, when the physical regions set in the first and second in the access order shown in FIG. 8 are absent on the non-volatile memory (701), so that the physical regions set in the first and second in the access order are on the disk (702), an access has to wait until the spin up of he disk (702) is completed. This extends the start-up time and adversely affects attempts to shorten the start-up time by storing the boot program in the non-volatile memory (701).

Figure 9:
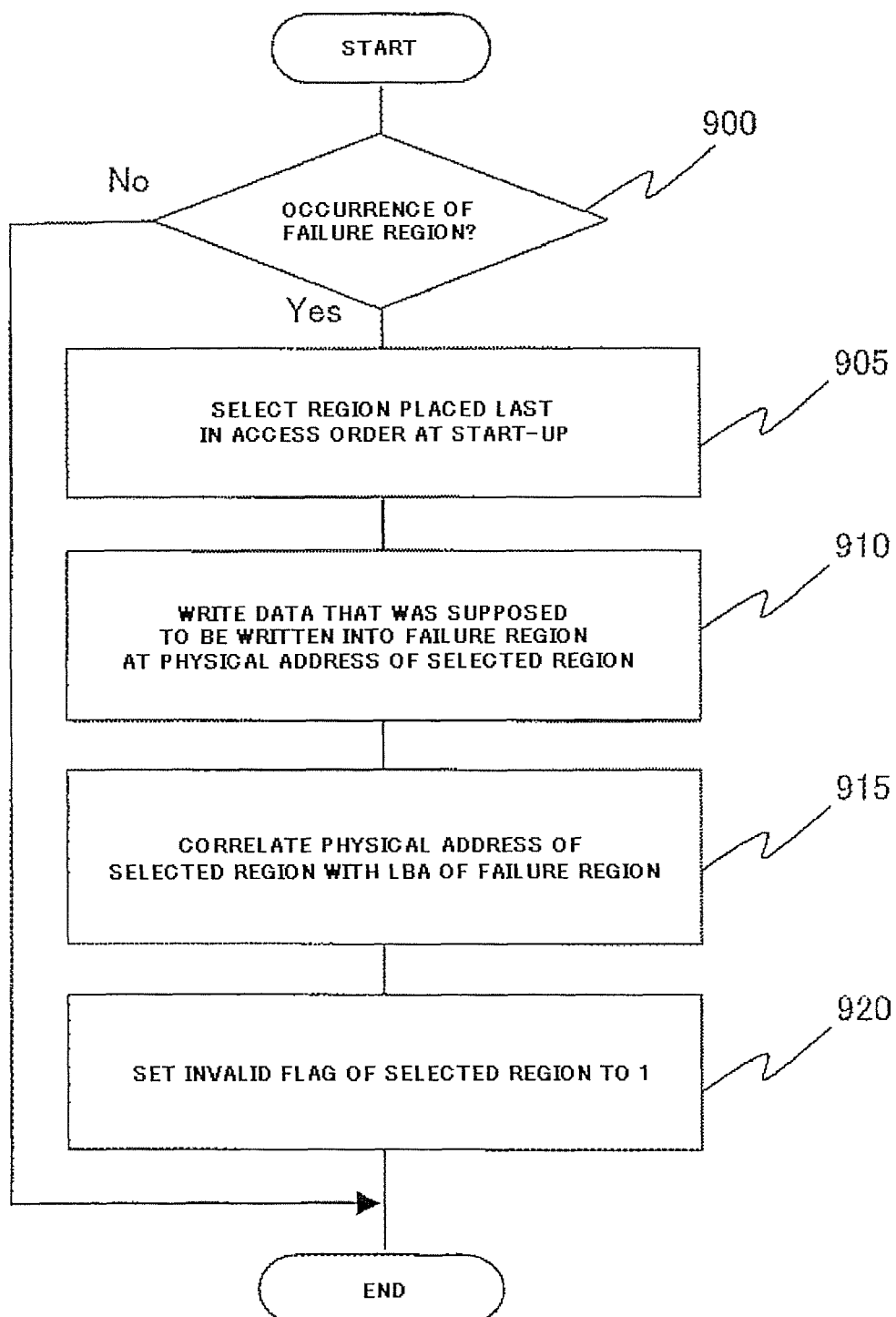
FIG. 9 is a flow chart illustrating an example process in the disk drive, in accordance with the second embodiment of the present invention.

With reference now to FIG. 9, in accordance with the second embodiment of the present invention, a flow chart is shown. The flow chart shows a controller, identified with control portion (705), at the occurrence of a failure region in a part of the region into which the boot program has been written in a case in which a program run at the start-up of the host has been stored in the non-volatile memory (701). In order to improve the overwriting endurance, data is re-allocated in the non-volatile memory so that the number of overwrites for each block, which is an overwriting unit of the non-volatile memory, becomes equal. This control is referred to as wear leveling. Normally, the boot program is not updated. However, in a case in which a part of the non-volatile memory is used as a region in which to cache the data from the disk or a region in which to buffer write data, it may happen that the boot program is written into another region with a high overwrite frequency due to the process of the wear leveling. In this instance, a failure region may possibly occur in the region into which the boot program has been written.

With further reference to FIG. 9, in accordance with the second embodiment of the present invention, the flow chart details a process at the occurrence of a failure region after a replaceable region pre-set in the non-volatile memory (701) has been exhausted. At 900, occurrence of a failure region in the non-volatile memory (701) is tested for; upon occurrence of the failure region, the disk drive (700), at 905, selects a region placed last in the access order at the start-up in the program stored in the non-volatile memory (701). According to the access order management table (704) of FIG. 8, a region at the LBA starting with 0x34400244 is to be accessed last (162'nd access) at the start-up. The disk drive (700) therefore selects this region. At 910, the disk drive (700) writes the data that was supposed to be written into the failure region at the physical address of the selected region; and, at 915, the disk drive (700) correlates the physical address of the selected region with the LBA of the failure region. At 920, the disk drive (700) then sets the invalid flag (825) of the selected region to 1 in the access order management table (704). Accordingly, when the region with the invalid flag exhibiting 1 is accessed next time, which occurs when the host is started next time, an access to the non-volatile memory (701) is switched to an access to the disk (702).

With further reference to FIG. 9, in accordance with the second embodiment of the present invention, upon occurrence of a failure region on the non-volatile memory (701), the disk drive (700) replaces the failure region with a region with the invalid flag (825) in the access order management table (704) exhibiting 0 sequentially in ascending access order at the start-up and uses this region. In a case in which the size of the selected region is larger than the size of the failure region, the disk drive (700) subtracts the size of the failure region from the size registered in the access order management table (704) and newly registers the remaining size as the size of this region. In this instance, the disk drive (700) does not set the invalid flag to 1. For example, the size of the failure region may be 32 sectors and the selected region is a region at the LBA starting with 0x3440244 in the access order management table (704). In such a case, because the size of the region at the LBA starting with 0x34400224 is 256 sectors, the disk drive (700) overwrites the size (810) in the access order management table (704) to 224 sectors while leaving the invalid flag exhibiting 0 intact.

With further reference to FIG. 9, in accordance with the second embodiment of the present invention, in a case in which the size of the selected region is smaller than the size of the failure region, the disk drive (700) correlates a size of the failure region as large as the size of the selected region with the selected region and sets the invalid flag of the selected region to 1. Furthermore, the disk drive (700) newly selects a region placed second last after the selected region in the access order and correlates the remaining region of the failure region with this newly selected region. In accordance with the second embodiment of the present invention, the failure region is replaced with a region in the non-volatile memory sequentially in ascending access order that is preliminarily determined. It is therefore possible to minimize the influences to accesses according to the preliminarily determined access order. In particular, the start-up of the host by the boot program that is accessed in the preliminarily determined access order is hardly affected by the spin up time of the disk.

Third Embodiment of the Present Invention

Figure 10:
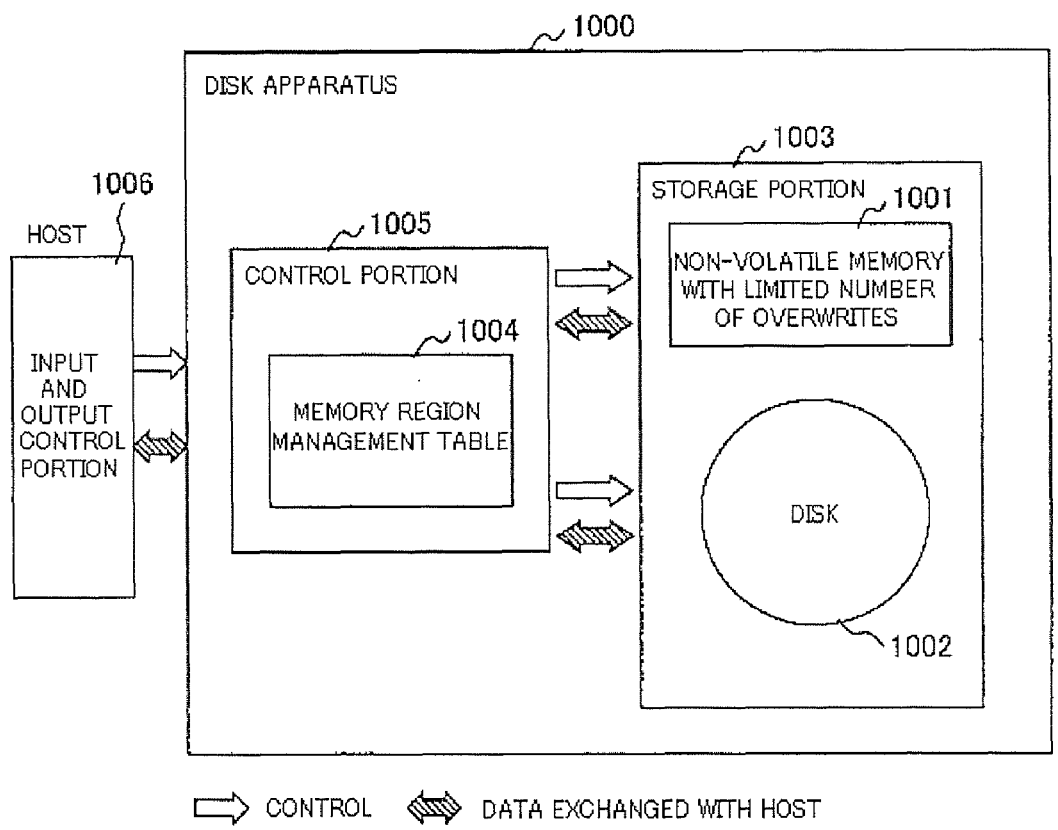
FIG. 10 is a block diagram illustrating an example configuration of a disk drive, in accordance with a third embodiment of the present invention.

With reference now to FIG. 7, in accordance with a third embodiment of the present invention, a block diagram is shown; the block diagram shows a further example configuration of a disk drive (1000). The disk drive (1000) has a storage portion (1003) including a non-volatile memory (1001) with a limited number of overwrites and a disk (1002) and a controller, which is identified with control portion (1005) of the disk drive (1000) as shown in FIG. 10, provided with a memory region management table (1004) used to manage addresses of data on the non-volatile memory (1001). In addition, the disk drive (1000) has a cache region in which to store data on the disk (1002) and a buffer region in which to store write data transferred from the host (1006) in the non-volatile memory (1001).

With reference now to FIG. 11, in accordance with the third embodiment of the present invention, a diagram is shown; the diagram shows an example of the memory region management table (1004) used to manage regions on the non-volatile memory. The memory region management table (1004) has items under the title of type of region (1110), range of region (1115), which is given by a start address and a final address, and size of region (1120). As shown in FIG. 11, each of the buffer region and the cache region is a continuous single region, which has a respective start address and final address, specified by an LBA. However, each of the buffer region and the cache region may extend across a plurality of divided regions. The disk drive (1000) corrects the start address and the end address (1115) and the size (1120) of each of the buffer and cache regions in the memory region management table (1004) according to the size of the processed region in response to the process performed for a failure region.

Figure 12:
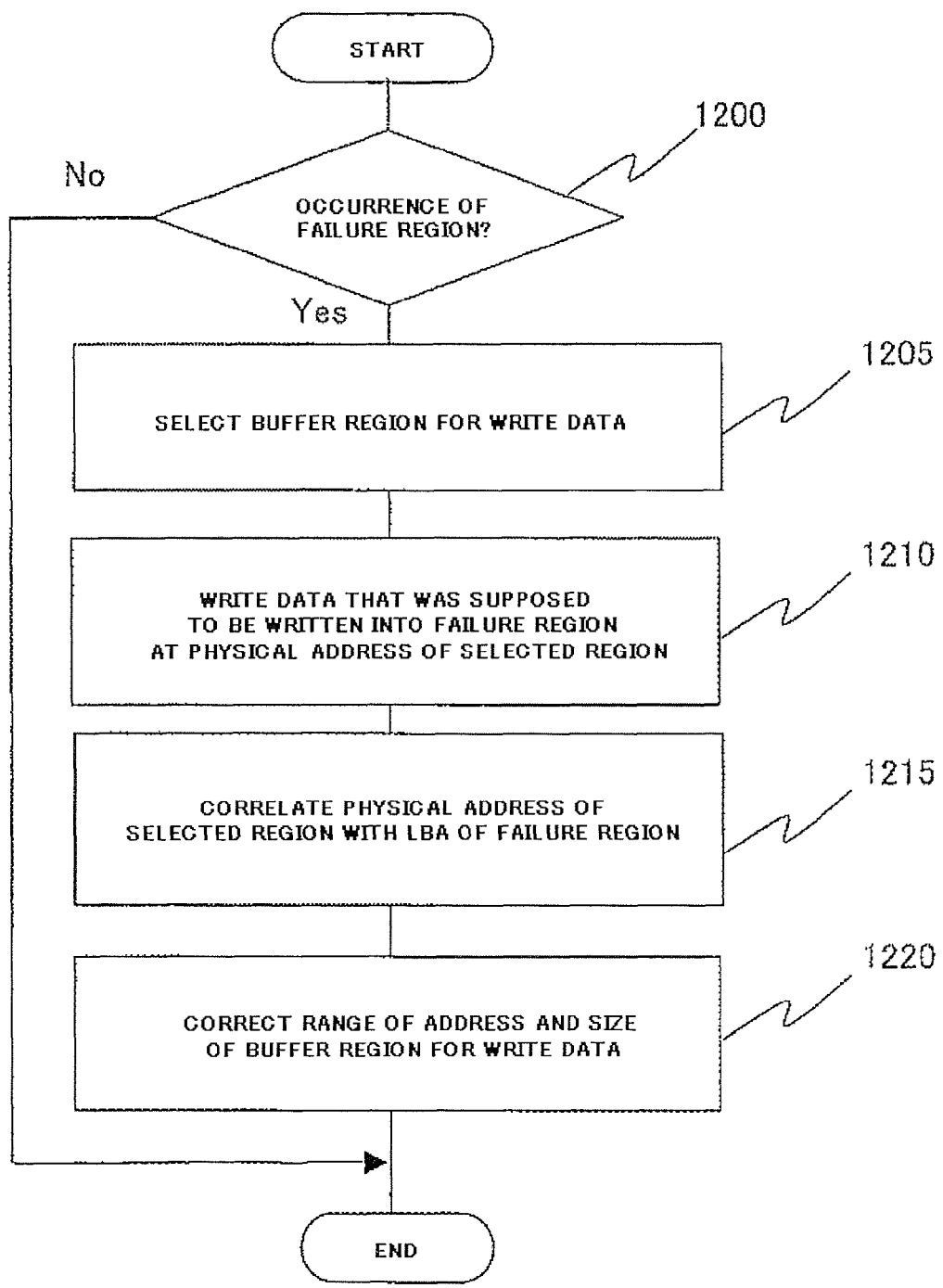
FIG. 12 is a flow chart illustrating an example process in the disk drive, in accordance with the third embodiment of the present invention.

With reference now to FIG. 12, in accordance with the third embodiment of the present invention, a flow chart is shown. The flow chart shows an example process in the controller, identified with control portion (1005), at the occurrence of a failure region under the circumstance in which the non-volatile memory (1001) in the disk drive (1000) is used as the buffer region for write data and the cache region for data on the disk (1002). As shown in FIG. 12, the flow chart details a case in which the failure region occurred after a replaceable region pre-set in the non-volatile memory (1001) has been exhausted. Programs, for example, the program run at the start-up and an application program with high access frequency, may be stored in the cache region. At 1200, the occurrence of a failure region is tested for; upon occurrence of the failure region, the disk drive (1000), at 1205, selects a buffer region for write data in order to address the failure region. For example, the disk drive (1000) selects a region in order of descending LBA's from a buffer region for write data. At 1210, the disk drive (1000) then writes the data that was supposed to be written into the failure region at the physical address of the selected region. In a case in which the disk drive (1000) selects a region on the buffer region for write data, the disk drive (1000) selects a region in which write data, which is write data that is not destaged, that is not written into the disk has not been stored (1002). In a case in which the buffer region for write data is full of write data that is not destaged, the disk drive (1000) writes the write data into the disk first and then selects a region in which the write data that is now written into the disk was stored. Subsequently, at 1215, the disk drive (1000) correlates the physical address of the selected region with the LBA of the failure region.

Figure 13:
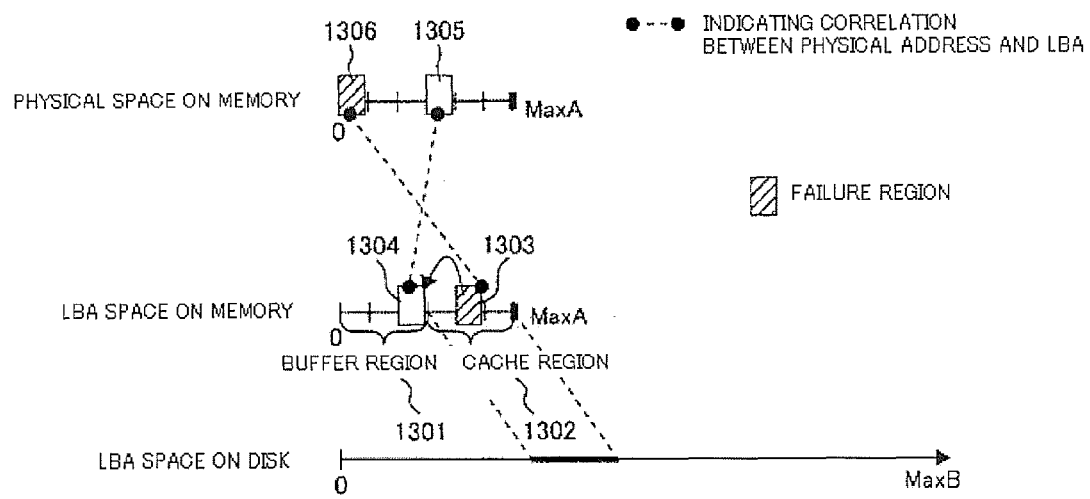
FIG. 13 is a diagram illustrating example operations, in accordance with the third embodiment of the present invention.

With further reference to FIG. 12 and reference now to FIG. 13, in accordance with the third embodiment of the present invention, a diagram is shown that illustrates example operations in a case in which a buffer region (1301) for write data and a cache region (1302) in which to copy the data on the disk (1002) are provided in the non-volatile memory (1001) in the disk drive (1000). As shown in FIG. 13, a failure region (1306) occurs in the cache region (1303). The disk drive (1000) therefore selects a region in the buffer region for write (1304); and, at 1210 of FIG. 12, writes the data that was supposed to be written in the region in which the failure occurred at the physical address (1305) of the selected region. At 1215, after 1210, the disk drive (1000) correlates the physical address (1305) of this region with the LBA (1303) of the failure region. Subsequently, at 1220, the disk drive (1000) corrects the range of address and the size of the buffer region for write data according to the size of the selected region. While descriptions have been given to a case in which a region to address the occurrence of a failure is selected from the buffer region for a write by giving a higher priority to a data transfer rate of the read data to the host, a region to address the occurrence of a failure may be selected from the cache region by giving a higher priority to power saving. The priorities assigned to a data transfer rate and power saving may be preliminarily set in the disk drive or determined by the host or the user.

Figure 14:
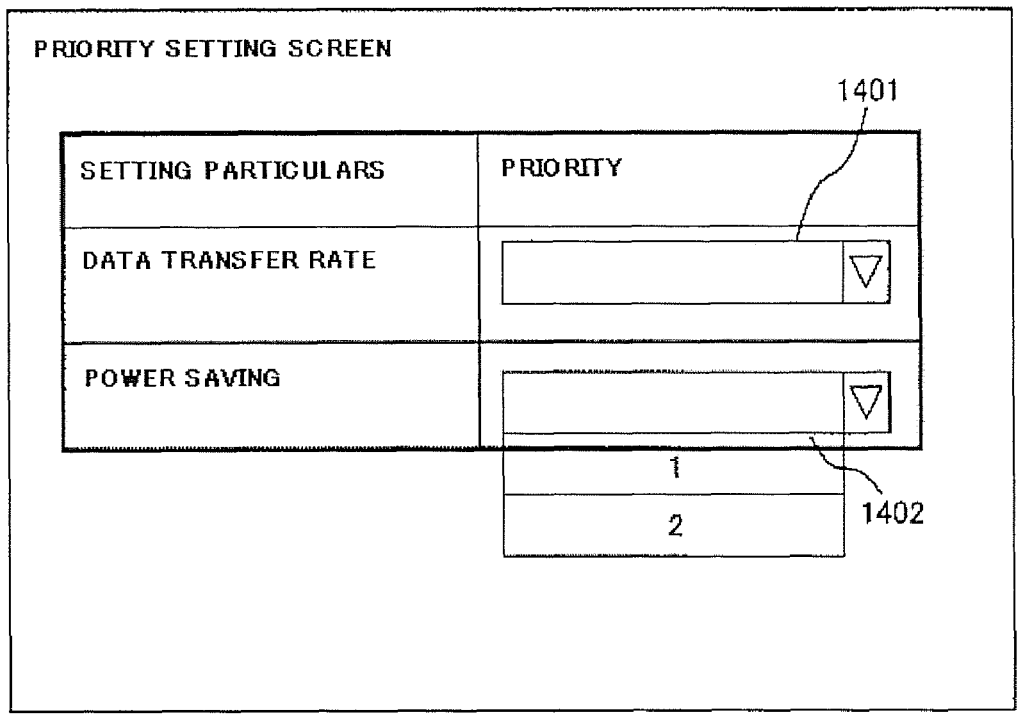
FIG. 14 is a diagram illustrating an example user interface screen, in accordance with the third embodiment of the present invention.

With reference now to FIG. 14, in accordance with the third embodiment of the present invention, a diagram is shown that illustrates an example user interface screen used by the user when the user determines the priorities of the data transfer rate and power saving. Each user determines the priority using the user interface of the host. The user selects the priorities of the setting items for each of the data transfer rate and the power saving using pull-down menus 1401 and 1402. In a case in which the user gives the same priority to the respective setting particulars, a pop-up window is displayed to attract the attention of the user to a setting error.

Figures 15, 16:
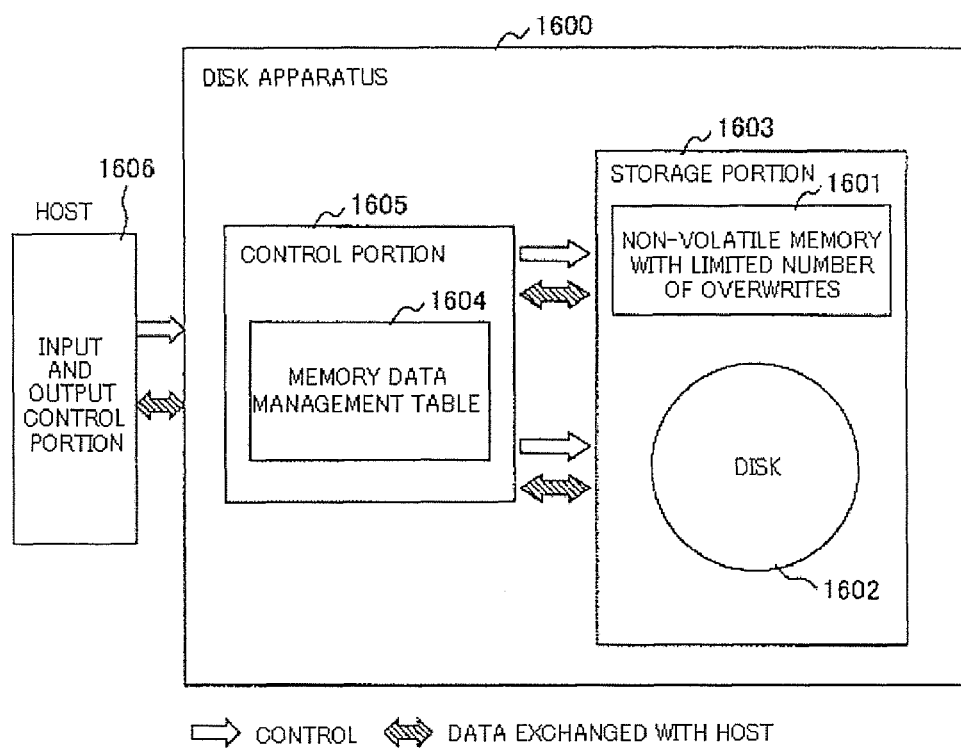
FIG. 15 is a diagram illustrating an example user interface screen, in accordance with the third embodiment of the present invention.
FIG. 16 is a block diagram illustrating an example configuration of a disk drive, in accordance with a fourth embodiment of the present invention.

With reference now to FIG. 15, in accordance with the third embodiment of the present invention, a diagram is shown that illustrates an example configuration of a priority management table in which to store the settings made by the user on the setting screen of FIG. 14. The priority management table is formed of items under the title of type of region and priority of each region. The priorities set by the user on the priority setting screen of FIG. 14 are converted to the priorities of the cache region and the buffer region and recorded in the priority management table in the converted forms. For the example user interface screen of FIG. 14, the priority assigned to the data transfer rate is converted to the priority of the cache region while the priority assigned to the power saving is converted to the priority of the buffer memory, and both are stored in the converted forms.

With further reference to FIG. 15, in accordance with the third embodiment of the present invention, the values, which are given by the priorities, set forth in the table of FIG. 15 are set by providing a command interface that sets parameters in the disk drive (1000) from the host (1006) and the values are set in the disk drive (1000) using this interface. For example, as a command in accordance with the AT Attachment, which is the formal standards of the Integrated Drive Electronics standardized by the American Standards Association, a Set Features Command is used as a command to set parameters in the disk drive (1000). The priorities of the regions on the non-volatile memory are set by extending this command. In accordance with the third embodiment of the present invention, the disk drive (1000) has a cache region in which to store data on the disk and a buffer region in which to store write data transferred from the host in the non-volatile memory, and uses a region with the lower priority assigned correspondingly to this region by replacing the failure region with this region. Thus, in accordance with the third embodiment of the present invention, it becomes possible to minimize effects on regions assigned with higher priorities.

Fourth Embodiment of the Present Invention

With reference now to FIG. 16, in accordance with a fourth embodiment of the present invention, a block diagram is shown; the block diagram shows an alternative example configuration of a disk drive. The disk drive (1600) has a storage portion (1603) including a non-volatile memory (1601) with a limited number of overwrites and a disk (1602) and a controller, which is identified with control portion (1605) of the disk drive (1600) as shown in FIG. 16, provided with a memory data management table (1604) used to manage data on the non-volatile memory. The disk drive (1600) of this embodiment copies data in a part of a region in the disk (1602) into the non-volatile memory (1601) to be stored therein.

With reference now to FIG. 18, in accordance with the fourth embodiment of the present invention, a diagram is shown; the diagram shows an example configuration of the memory data management table (1604) used to manage data that cannot be removed from the non-volatile memory (1601) without an instruction from the host (1606) and data that may be removed from the non-volatile memory (1601) without an instruction from the host (1606). The memory address management table (1604) has items under the title of LBA (1810), physical address on non-volatile memory (1815), size of data (1820), flag (1825) indicating whether removal of data by an instruction from members other than the host (1606) is allowed or inhibited, and invalid flag (1830) indicating a region is invalid.

With reference now to FIG. 19, in accordance with the fourth embodiment of the present invention, a diagram is shown; the diagram shows the configuration of a command, ADD LBA(S) TO NV CACHE PINNED SET, to write in data that cannot be removed without an instruction from the host onto the flash memory in accordance with the AT Attachment 8-ATA/ATAPI Command Set (ATA8-ACS). A command in accordance with the ATA8-ACS is formed of Command (1905), Device (1910), LBA (1915), Count (1920), and Feature (1925). In the command, ADD LBA(S) TO NV CACHE PINNED SET, B6h, which indicates a flash cache command is set in the Command (1905), the following are set: a bit indicating a state of the device is set in the Device (1910); a bit indicating that the data to be transferred to the cache is either write data from the host or data read from the disk is set in the LBA (1915); the number of sectors of data to be transferred to the cache is set in the Count (1920); and a code specifying the type of NV Cache Commands is set in the Feature (1925). In accordance with the ATA8-ACS, data that cannot be removed without an instruction form the host may be transferred onto the non-volatile memory using the command described above.

With reference now to FIG. 19, in accordance with the fourth embodiment of the present invention, the disk drive (1600) is able to store data that cannot be removed without an instruction from the host (1606) onto the non-volatile memory (1601) using ADD LBA(S) TO NV CACHE PINNED SET, as has been described. Moreover, the disk drive (1600) is able to store data that may be processed within the disk drive (1600) alone into the non-volatile memory (1601). In a case in which the disk drive (1600) has written data onto the non-volatile memory (1601) using the command of FIG. 19, the disk drive (1600) sets all the flags (1825) in the memory address management table (1604) of FIG. 18 each indicating whether removal by members other than the host (1606) is allowed or inhibited to 1.

Figure 17:
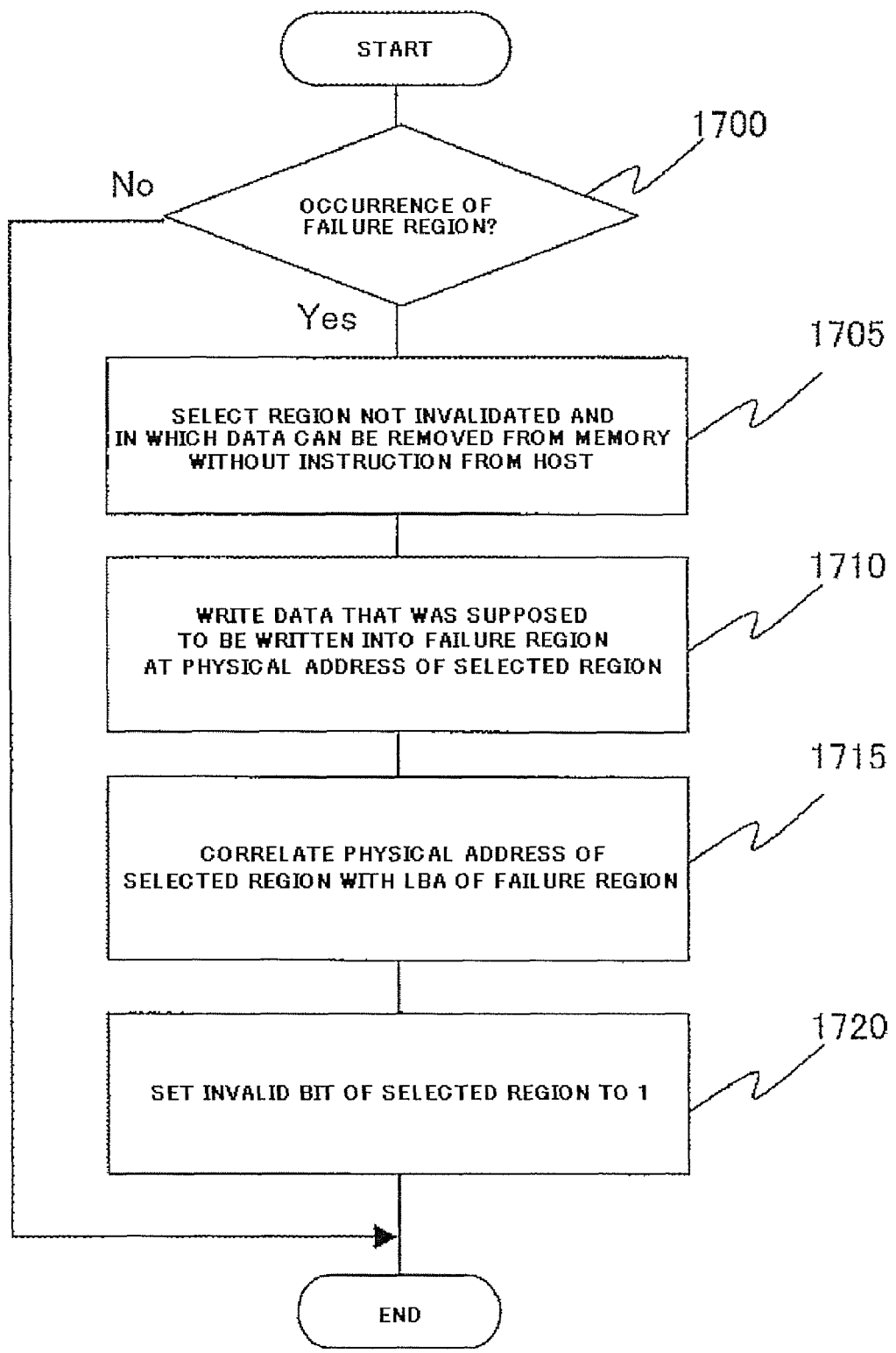
FIG. 17 is a flow chart illustrating an example process in the disk drive, in accordance with the fourth embodiment of the present invention.

With reference now to FIG. 17, in accordance with the fourth embodiment of the present invention, a flow chart is shown. The flow chart shows an example process in the disk drive (1600) at the occurrence of a failure region in the non-volatile memory (1601) while data that cannot be removed from the non-volatile memory (1601) without an instruction from the host (1606) and data that may be removed from the non-volatile memory (1601) without an instruction from the host (1606) are stored in the non-volatile memory (1601), so that the disk drive (1600) addresses the failure region by selecting a region of the data that may be removed from the memory without an instruction from the host (1606). As shown in FIG. 17, the flow chart details a process at the occurrence of a failure region after a replaceable region preset in the non-volatile memory (1601) has been exhausted. At 1700, the occurrence of a failure region is tested for; upon occurrence of the failure region, the disk drive (1600), at 1705, selects a region that is not invalidated, which is a region for which the invalid flag (1830) is not set to 1, and in which data may be removed from the memory without an instruction from the host (1606) with reference to the memory data management table (1604). At 1710, the disk drive (1600) then writes the data that was supposed to be written into the failure region at the physical address of the selected region. At 1715, the disk drive (1600) correlates the physical address of the selected region with the LBA of the failure region. Subsequently, at 1720, the disk drive (1600) sets the invalid bit (1830) of the selected region to I in the memory data management table (1604). Thus, in accordance with the fourth embodiment of the present invention, data that cannot be removed from the non-volatile memory without an instruction from the host and data that may be removed from the non-volatile memory without an instruction from the host are stored in the non-volatile memory and the disk drive uses a storage region of the data that may be removed form the non-volatile memory without an instruction from the host by replacing the failure region with this region. Accordingly, there is no affect on the data that cannot be removed form the non-volatile memory without an instruction from the host.

Thus, in accordance with the embodiments of the present invention described above, a disk drive including a non-volatile memory with a limited number of overwrites is enabled to continue to use the non-volatile memory efficiently even when a replaceable region in the non-volatile memory has been exhausted.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A disk drive, comprising:
a non-volatile memory that is incapable of being overwritten more than a limited number of times;

a disk; and a controller comprising a memory management table used to manage a correlation between a logical block address and a physical address of the non-volatile memory;

wherein, in absence of a replaceable region in the non-volatile memory and in response to an occurrence of a failure to write data in a region, defined as a failure region, in the non-volatile memory at a first physical address correlated with a first logical block address, the controller is configured to write the data at a second physical address correlated with a second logical block address of the non-volatile memory different from the first logical block address, and is configured to correlate in the memory management table the first logical block address with the second physical address, wherein a first region, which is configured to store data that cannot be invalidated without an instruction from a host system, and a second region, which is configured to store data that can be invalidated without an instruction from the host system, are provided in the non-volatile memory;

wherein the memory management table is configured to have information used to distinguish between the first region and the second region in correlation with a logical block address of the non-volatile memory; and wherein the controller is configured to select, as the second logical block address of the non-volatile memory, a logical block address corresponding to a region included in the second region with reference to the memory management table.

2. The disk drive of claim 1, wherein the disk is configured to have the replaceable region in the non-volatile memory; and wherein the controller is configured to select a logical block address continuing to a logical block address location on the disk in response to the occurrence of the failure to write data to the failure region regardless of a site of the failure region;

wherein the controller is configured to write the data in a second region within the replaceable region on the disk;

wherein the controller is configured to define a logical block address continuing to a logical block address in a storage region on the disk as the second logical block address;

wherein the controller is configured to write the data of the failure region at a physical address correlated with the second logical block address; and wherein the controller is configured to correlate the physical address of the second region with the first logical block address of the failure region.

3. The disk drive of claim 2, wherein the memory management table is configured to have a replacement bit correlated with a logical block address of the non-volatile memory;

wherein the controller is configured to set up the replacement bit correlated with the second logical block address in association with writing of the data stored at the physical address correlated with the second logical block address; and wherein the controller is configured to switch an access to the second logical block address to an access to the replaceable region on the disk with reference to the replacement bit.

4. The disk drive of claim 1, wherein the disk is configured to store a boot program of a host system connected to the disk;

wherein the non-volatile memory is configured to pre-store a copy of the boot program;

wherein the memory management table is configured to have an access order from the host system to the boot program stored in the non-volatile memory in correlation with a logical block address of the non-volatile memory; and wherein the controller is configured to select, as the second logical block address of the non-volatile memory, a logical block address placed last in the access order in the boot program stored in the non-volatile memory with reference to the access order.

5. The disk drive of claim 4, wherein the memory management table is configured to have an invalid bit correlated with a logical block address of the non-volatile memory;

wherein the controller is configured to set up the invalid bit correlated with the logical block address that has been selected; and wherein the controller is configured to switch an access to the non-volatile memory at the logical block address that has been selected to an access of the disk with reference to the invalid bit.

6. The disk drive of claim 1, wherein the controller is configured to select, as the second logical block address of the non-volatile memory, a logical block address corresponding to a region included in a region assigned with a lower priority with reference to priorities preliminarily assigned to regions in the non-volatile memory.

7. The disk drive of claim 6, wherein the priorities are set by a member of a group selected from the group consisting of a host and a user.

8. The disk drive of claim 6, wherein a cache region, which is configured to store data in a part of a region on the disk, and a buffer region, which is configured to store write data from a host system, are provided in the non-volatile memory; and wherein a priority that is high may be assigned to the cache region and a priority that is low may be assigned to the buffer region.

9. A method for controlling a disk drive, including a non-volatile memory incapable of being overwritten more than a limited number of times, a disk, and a memory management table configured to manage a correlation between an logical block address and a physical address of the non-volatile memory, the method comprising:

writing data, in absence of a replaceable region in the non-volatile memory and in response to an occurrence of a failure in a region at a physical address correlated with a first logical block address at which data is supposed to be written into the non-volatile memory, at a physical address correlated with a second logical block address of the non-volatile memory different from the first logical block address at which the data is supposed to be written; and correlating in the memory management table the first logical block address at which the data is supposed to be written with the physical address at which the data may be written, wherein a logical block address corresponding to a region included in a region assigned with a lower priority is selected as the second logical block address of the non-volatile memory with reference to priorities preliminarily assigned to regions in the non-volatile memory.

10. The method as recited in claim 9, further comprising:

configuring the disk to have the replaceable region in the non-volatile memory;

selecting a logical block address continuing to a logical block address location on the disk, provided that a failure region occurs in a region in which the data is supposed to be written regardless of a site of the failure region;

writing the data in the second region to the replaceable region on the disk;

defining a logical block address continuing to a logical block address in a storage region in the disk as the second logical block address;

writing the data in the failure region at a physical address correlated with the second logical block address; and correlating the physical address of the region in which the data may be written with the first logical block address at which the data is supposed to be written.

11. The method as recited in claim 10, wherein the memory management table has a replacement bit correlated with a logical block address of the non-volatile memory;

wherein the replacement bit correlated with the second logical block address is set up in association with writing of the data stored at the physical address correlated with the second logical block address; and wherein an access to the second logical block address on the non-volatile memory is switched to an access to the replaceable region on the disk with reference to the replacement bit.

12. The method as recited in claim 9, wherein the disk stores a boot program of a host system connected to the disk;

wherein the non-volatile memory pre-stores a copy of the boot program;

wherein the memory management table has an access order from the host system to the boot program stored in the non-volatile memory in correlation with a logical block address of the non-volatile memory; and wherein a logical block address placed last in the access order in the boot program stored in the non-volatile memory is selected as the second logical block address of the non-volatile memory with reference to the access order.

13. The method as recited in claim 12, wherein the memory management table has an invalid bit correlated with a logical block address of the non-volatile memory;

wherein the invalid bit correlated with the logical block address that has been selected is set up; and wherein an access to the non-volatile memory at the logical block address that has been selected is switched to an access to the disk with reference to the invalid bit.

14. The method as recited in claim 9, wherein the priorities are set by a member of a group selected from the group consisting of a host and a user.

15. The method as recited in claim 9, wherein a cache region in which to store data in a part of a region on the disk and a buffer region in which to store write data from a host system are provided in the non-volatile memory; and wherein the priority assigned to the cache region is high and the priority assigned to the buffer region is low.

16. The method as recited in claim 9, wherein a first region in which to store data that cannot be invalidated without an instruction from a host system and a second region in which to store data that can be invalidated without an instruction from the host system are provided in the non-volatile memory;

wherein the memory management table has information used to distinguish between the first region and the second region in correlation with a logical block address of the non-volatile memory; and wherein a logical block address corresponding to a region included in the second region is selected as the second logical block address of the non-volatile memory with reference to the memory management table.

* * * * *